United States Patent
Desiano et al.

(10) Patent No.: US 9,420,728 B2
(45) Date of Patent: Aug. 16, 2016

(54) LIQUID-COOLED HEAT SINK CONFIGURED TO FACILITATE DRAINAGE

(71) Applicant: INTERNATIONAL BUSINESS MACHINES CORPORATION, Armonk, NY (US)

(72) Inventors: Frank M. Desiano, Poughkeepsie, NY (US); David L. Edwards, Poughkeepsie, NY (US); Robert K. Mullady, Poughkeepsie, NY (US); Donald W. Porter, Highland, NY (US); Randy Zoodsma, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 201 days.

(21) Appl. No.: 14/252,971

(22) Filed: Apr. 15, 2014

(65) Prior Publication Data

US 2015/0296659 A1    Oct. 15, 2015

(51) Int. Cl.
*H05K 7/20*      (2006.01)

(52) U.S. Cl.
CPC ................... *H05K 7/20772* (2013.01)

(58) Field of Classification Search
CPC .......... H05K 7/20272; H05K 7/20263; H05K 7/20254; H05K 7/20772
USPC ....... 361/679.46–679.54, 688–723; 165/80.4, 80.5, 104.28, 104.33, 168, 165/177, 185
See application file for complete search history.

(56) References Cited

U.S. PATENT DOCUMENTS

| | | | |
|---|---|---|---|
| 5,264,984 | A | 11/1993 | Akamatsu |
| 5,269,372 | A | 12/1993 | Chu et al. |

(Continued)

FOREIGN PATENT DOCUMENTS

JP    02-078260 A    3/1990

OTHER PUBLICATIONS

Campbell et al., "Coolant-Cooled Heat Sink Configured for Accelerating Coolant Flow", U.S. Appl. No. 14/058,562, filed Oct. 21, 2013 (40 pages).

(Continued)

*Primary Examiner* — Anthony Haughton
*Assistant Examiner* — Yahya Ahmad
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooling apparatuses, cooled electronic modules, and methods of fabrication are provided which facilitate heat transfer from one or more electronic components to a liquid coolant in an operational mode, and drainage of coolant therefrom in a transport mode. The cooling apparatus includes a liquid-cooled heat sink configured to horizontally couple along a main heat transfer surface to the electronic component(s). The heat sink includes a thermally conductive structure with a coolant-carrying compartment through which coolant flows, and a coolant inlet tube and a coolant outlet tube affixed to the thermally conductive structure and in fluid communication with the coolant-carrying compartment to facilitate coolant flow through the compartment. The coolant-carrying compartment has a base surface, and the coolant outlet tube extends into the coolant-carrying compartment towards the base surface to facilitate withdrawal of the liquid coolant from the compartment in the transport mode of the cooling apparatus.

9 Claims, 6 Drawing Sheets

(56) References Cited

U.S. PATENT DOCUMENTS

| | | | |
|---|---|---|---|
| 5,390,076 A | 2/1995 | Umezawa | |
| 7,508,672 B2 | 3/2009 | Hamman | |
| 7,537,047 B2 | 5/2009 | Lai et al. | |
| 7,608,924 B2 | 10/2009 | Myers et al. | |
| 7,940,527 B2 | 5/2011 | Krause | |
| 7,983,044 B2 | 7/2011 | Nakamura et al. | |
| 8,387,249 B2 | 3/2013 | Chu et al. | |
| 2005/0083656 A1* | 4/2005 | Hamman | F28D 15/00 361/699 |
| 2006/0250773 A1* | 11/2006 | Campbell | H01L 23/4735 361/699 |
| 2007/0039716 A1 | 2/2007 | Yeh et al. | |
| 2009/0284921 A1* | 11/2009 | Colgan | H01L 23/473 361/699 |
| 2009/0294106 A1* | 12/2009 | Flotta | H01L 23/4735 165/104.33 |
| 2009/0316360 A1* | 12/2009 | Campbell | H01L 23/473 361/699 |
| 2014/0085823 A1* | 3/2014 | Campbell | H05K 7/20236 361/701 |
| 2015/0237767 A1* | 8/2015 | Shedd | H05K 7/20254 165/104.31 |

OTHER PUBLICATIONS

Desiano et al., "Liquid-Cooled Heat Sink Configured to Facilitate Drainage", U.S. Appl. No. 15/183,900, filed Jun. 16, 2016 (34 pages).

Desiano et al., "Liquid-Cooled Heat Sink Configured to Facilitate Drainage", U.S. Appl. No. 15/183,910, filed Jun. 16, 2016 (35 pages).

Desiano et al., List of IBM Patents and/or Patent Applications Treated as Related, U.S. Appl. No. 14/252,971, filed Apr. 15, 2014 (U.S. Patent Publication No. 2015/0296659 A1), dated Jun. 16, 2016 (2 pages).

* cited by examiner

LIQUID-COOLED HEAT SINK CONFIGURED TO FACILITATE DRAINAGE

BACKGROUND

As is known, operating electronic components produce heat. This heat should be removed in an effective manner to maintain device junction temperatures within desirable limits, with failure to do so resulting in excessive component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to dissipate more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques using, for instance, liquid cooling.

BRIEF SUMMARY

In one aspect, provided herein is a cooling apparatus comprising a liquid-cooled heat sink. The liquid-cooled heat sink includes: a thermally conductive structure configured to couple along a horizontal main heat transfer surface thereof to at least one electronic component to be cooled, the thermally conductive structure including a coolant-carrying compartment through which liquid coolant flows, at least in part, in a direction substantially parallel to the main heat transfer surface of the thermally conductive structure; a coolant inlet tube and a coolant outlet tube associated with the thermally conductive structure and in fluid communication with the coolant-carrying compartment of the thermally conductive structure to facilitate the liquid coolant flow therethrough; and wherein the coolant-carrying compartment of the thermally conductive structure comprises a base surface, and the coolant outlet tube extends into the coolant-carrying compartment towards the base surface thereof to facilitate withdrawal of the liquid coolant therefrom for a transport mode of the cooling apparatus.

In another aspect, a cooled electronic module is provided which includes at least one electronic component, and a cooling apparatus to facilitate cooling the at least one electronic component. The cooling apparatus includes a liquid-cooled heat sink horizontally coupled to the at least one electronic component to be cooled. The liquid-cooled heat sink comprises: a thermally conductive structure with a coolant-carrying compartment through which coolant flows, at least in part, in a direction substantially parallel to the horizontal main heat transfer surface of the liquid-cooled heat sink; and a coolant inlet tube and a coolant outlet tube associated with the thermally conductive structure and in fluid communication with the coolant-carrying compartment of the thermally conductive structure to facilitate the liquid coolant flow therethrough. The coolant-carrying compartment of the thermally conductive structure further includes a base surface, and the coolant outlet tube extends into the coolant-carrying compartment towards the base surface thereof to facilitate withdrawal of the liquid coolant therefrom for a transport mode of the cooled electronic module.

In a further aspect, a method is provided which includes providing a cooling apparatus comprising a liquid-cooled heat sink configured to facilitate cooling at least one electronic component, the cooling apparatus having an operational mode and a transport mode. The liquid-cooled heat sink includes: a thermally conductive structure configured to couple along a horizontal main heat transfer surface thereof to the at least one electronic component to be cooled, the thermally conductive structure including a coolant-carrying compartment through which liquid coolant flows, at least in part, in a direction substantially parallel to the horizontal main heat transfer surface of the thermally conductive structure; a coolant inlet tube and a coolant outlet tube associated with the thermally conductive structure and in fluid communication with the coolant-carrying compartment of the thermally conductive structure to facilitate the liquid coolant flow therethrough; and wherein the coolant-carrying compartment of the thermally conductive structure comprises a base surface, and a coolant outlet tube extends into the coolant-carrying compartment towards the base surface thereof to facilitate withdrawal of the liquid coolant therefrom in the transport mode of the cooling apparatus.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
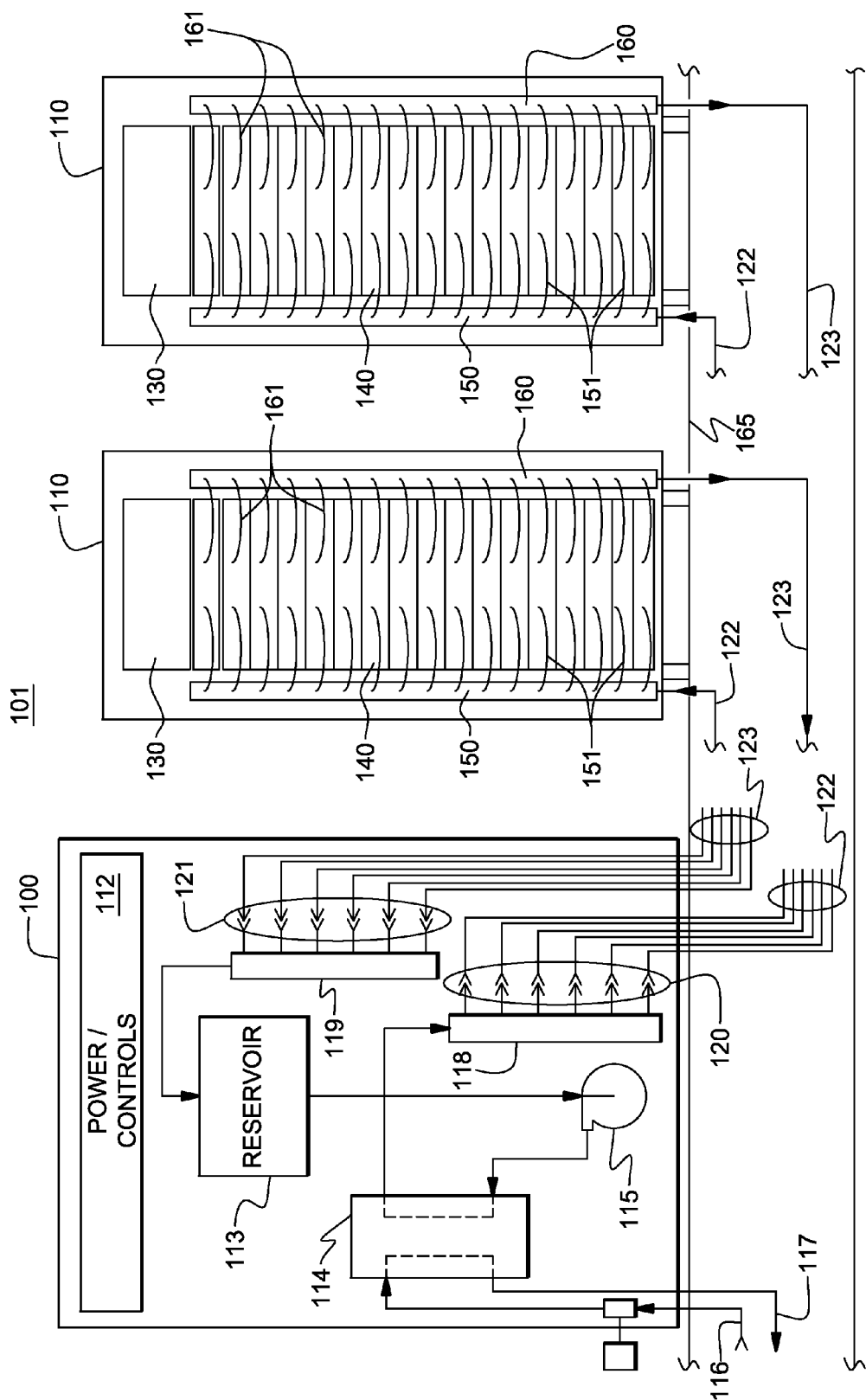
FIG. 1 depicts one embodiment of a liquid-cooled data center comprising a coolant distribution unit which facilitates liquid-cooling of electronics racks of the data center, in accordance with one or more aspects of the present invention.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with rack-mounted electronic drawers being an example of systems of an electronics rack to be cooled.

"Electronic component" refers to any heat-generating electronic component of, for example, a computer system or other electronics unit requiring cooling. By way of example, an electronic component may comprise one or more integrated circuit die (or chips) and/or other electronic devices to be cooled, including one or more processor chips, memory chips and/or memory support chips. Further, the term "cold plate" refers to any thermally conductive structure having one or more compartments, channels, passageways, etc., formed therein for flowing of coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolants discussed herein, such as the facility coolant or system coolant, is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate an understanding thereof, wherein the same reference numbers used throughout different figures designate the same or similar components.

In one embodiment, an air-cooled data center may have a raised floor layout, where multiple electronics racks are disposed in one or more rows. Such a data center may house several hundred, or even several thousand microprocessors. In one implementation, chilled air enters the computer room via perforated floor tiles from a supply air plenum defined between the raised floor and a base or sub-floor of the room. Cooled air is taken in through louvered covers at air inlet sides of the electronics racks and expelled through the back (i.e., air outlet sides) of the electronics racks. Each electronics rack may have one or more air moving devices (e.g., fans or blowers) to provide forced inlet-to-outlet airflow to cool the electronic devices within the system(s) of the rack. The supply air plenum provides conditioned and cooled air to the air-inlet sides of the electronics racks via perforated floor tiles disposed in a "cold" aisle of the computer installation. The conditioned and cooled air is supplied to the under-floor plenum by one or more air conditioning units, also disposed within the data center. Room air is taken into each air conditioning unit typically near an upper portion thereof. This room air may comprise in part exhausted air from the "hot" aisles of the computer installation defined, for example, by opposing air outlet sides of the electronics racks.

Figure 2:
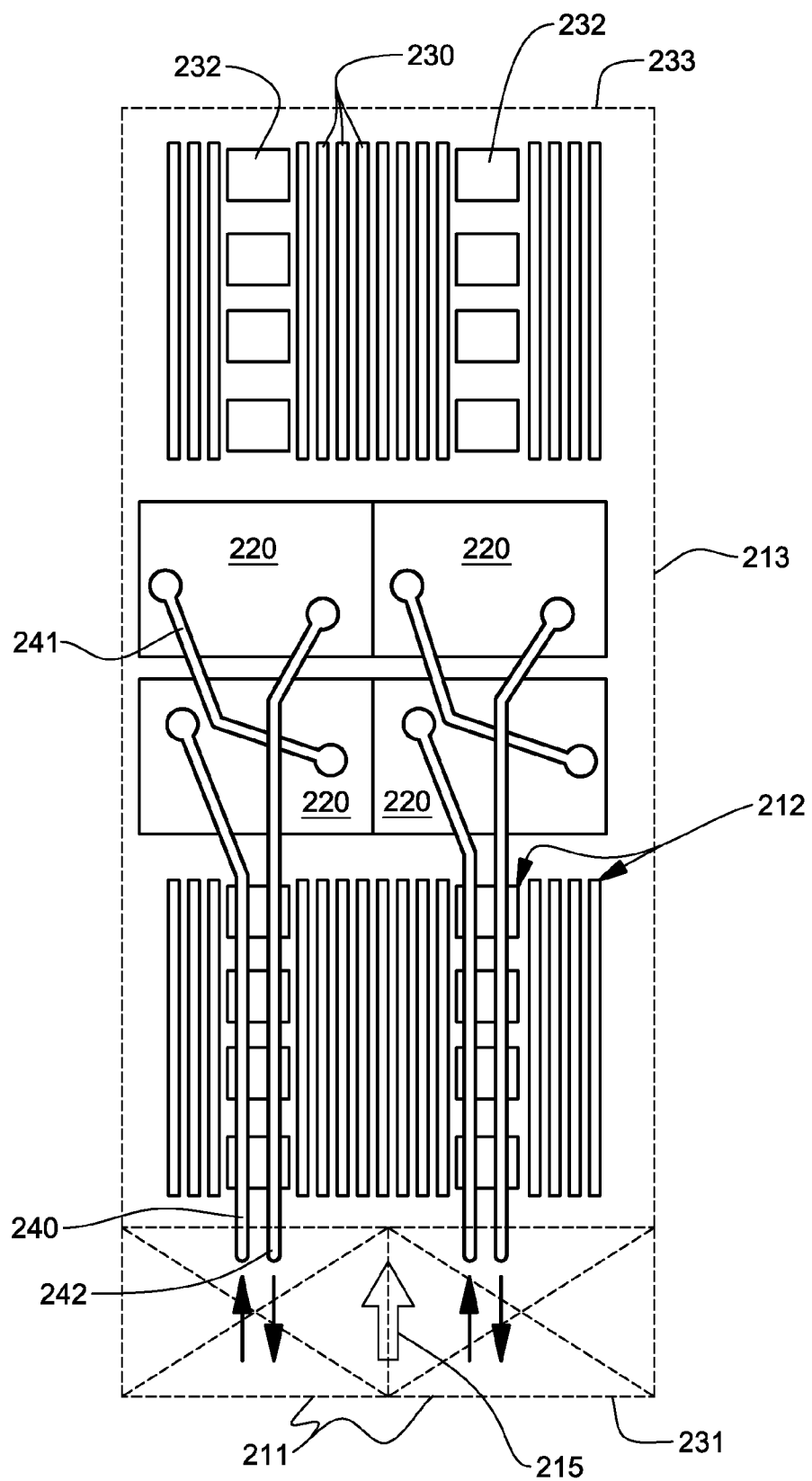
FIG. 2 is a plan view of one embodiment of an electronic system (or node) layout illustrating an air and liquid cooling apparatus for cooling components of the electronic system, in accordance with one or more aspects of the present invention.
Figure 3:
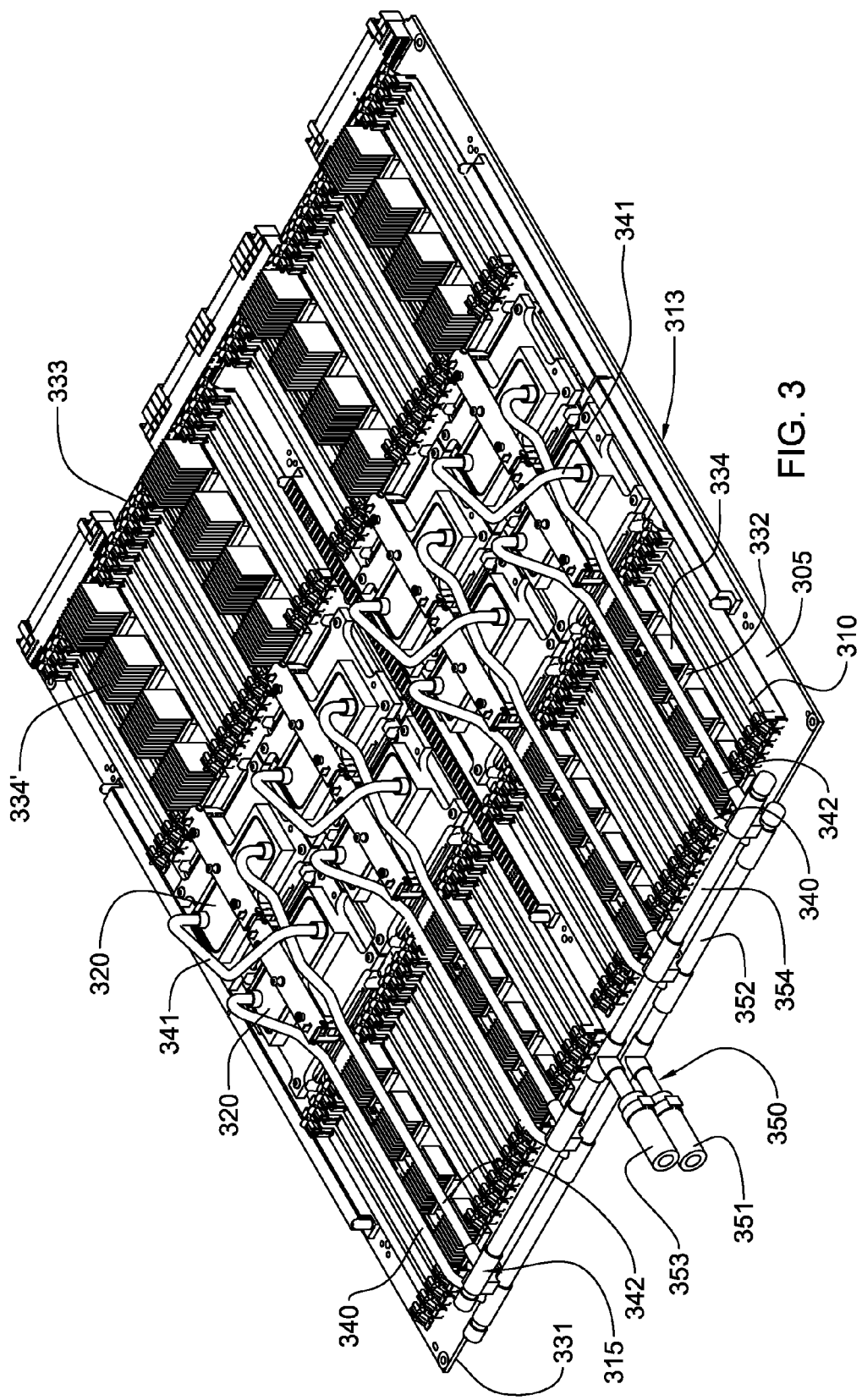
FIG. 3 depicts one detailed embodiment of a partially assembled electronic system layout, wherein the electronic system includes eight heat-generating electronic components to be cooled, each having, in one embodiment, a respective cooling apparatus associated therewith, in accordance with one or more aspects of the present invention.

Due to the ever-increasing airflow requirements through electronics racks, and the limits of air distribution within the typical data center installation, liquid-based cooling may, for instance, be combined with, or used in place of, the above-described conventional air-cooling. FIGS. 1-3 illustrate one embodiment of a data center implementation employing a liquid-based cooling system with one or more cold plates coupled to high heat-generating electronic components disposed within an electronics rack.

In particular, FIG. 1 depicts one embodiment of a data center 101 comprising a coolant distribution unit 100. The coolant distribution unit may be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant second pump), facility water inlet 116 and outlet 117 supply pipes, a supply manifold 118 supplying water or system coolant to the electronics racks 110 via couplings 120 and lines 122, and a return manifold 119 receiving water from the electronics racks 110, via lines 123 and couplings 121. Each electronics rack includes (in one example) a power/control unit 130 for the electronics rack, multiple electronic systems 140, a system coolant supply manifold 150, and a system coolant return manifold 160. As shown, each electronics rack 110 is disposed on a raised floor 165 of the data center 101, with lines 122 providing system coolant to system coolant supply manifolds 150 and lines 123 facilitating return of system coolant from system coolant return manifolds 160 being disposed in the supply air plenum beneath the raised floor.

In the embodiment illustrated, the system coolant supply manifold 150 provides system coolant to the cooling systems of the electronic systems (such as to liquid-cooled cold plates thereof) via flexible hose connections 151, which are disposed between the supply manifold and the respective electronic systems within the rack. Similarly, system coolant return manifold 160 is coupled to the electronic systems via flexible hose connections 161. Quick connect couplings may be employed at the interface between flexible hoses 151, 161 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 150 and returns system coolant to the system coolant return manifold 160.

FIG. 2 depicts one embodiment of an electronic system 213 component layout wherein one or more air moving devices 211 provide forced air flow 215 to cool multiple components 212 within electronic system 213. Cool air is taken in through a front 231 and exhausted out a back 233 of the system. The multiple components to be cooled include multiple processor modules to which liquid-cooled heat sinks 220 (of a liquid-based cooling system) are coupled, as well as multiple arrays of memory modules 230 (e.g., dual in-line memory modules (DIMMs)) and multiple rows of memory support modules 232 (e.g., DIMM control modules) to which air-cooled heat sinks are coupled. In the embodiment illustrated, memory modules 230 and the memory support modules 232 are partially arrayed near front 231 of electronic system 213, and partially arrayed near back 233 of electronic system 213. Also, in the embodiment of FIG. 2, memory modules 230 and the memory support modules 232 are cooled by air flow 215 across the electronic system.

The illustrated liquid-based cooling system further includes multiple coolant-carrying tubes connected to and in fluid communication with liquid-cooled heat sinks 220. The coolant-carrying tubes comprise sets of coolant-carrying tubes, with each set including (for example) a coolant supply tube 240, a bridge tube 241 and a coolant return tube 242. In this example, each set of tubes provides liquid coolant to a series-connected pair of heat sinks 220 (coupled to a pair of processor modules). Coolant flows into a first heat sink of each pair via the coolant supply tube 240 and from the first heat sink to a second heat sink of the pair via bridge tube or line 241, which may or may not be thermally conductive. From the second heat sink of the pair, coolant is returned through the respective coolant return tube 242. Note that in an alternate implementation, each liquid-cooled heat sink 220 could be coupled directly to a respective coolant supply tube 240 and coolant return tube 242, that is, without series connecting two or more of the liquid-cooled heat sinks FIG. 3 depicts in greater detail an alternate electronic system layout comprising eight processor modules, each having a respective liquid-cooled cold plate or heat sink of a liquid-based cooling system coupled thereto. The liquid-based cooling system is shown to further include associated coolant-carrying tubes for facilitating passage of liquid coolant through the liquid-cooled heat sinks and a header subassembly to facilitate distribution of liquid coolant to and return of liquid coolant from the liquid-cooled heat sinks By way of specific example, the liquid coolant passing through the liquid-based cooling subsystem is cooled and conditioned (e.g., filtered) water.

FIG. 3 is an isometric view of one embodiment of an electronic system or drawer, and a monolithic cooling system. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more heat sinks in series flow arrangement to facilitate cooling one or more electronic components to which the heat sinks are mechanically and thermally coupled. The number of parallel paths and the number of series-connected liquid-cooled heat sinks depends, for example, on the desired component temperature, available coolant temperature and coolant flow rate, and the total heat load being dissipated from each electronic component.

More particularly, FIG. 3 depicts a partially assembled electronic system 313 and an assembled liquid-based cooling system 315 coupled to primary heat-generating components (e.g., including processor die) to be cooled. In this embodiment, the electronic system is configured for (or as) a node of an electronics rack, and includes, by way of example, a support substrate or planar board 305, a plurality of memory module sockets 310 (with the memory modules (e.g., dual in-line memory modules) not shown), multiple rows of memory support modules 332 (each having coupled thereto an air-cooled heat sink 334), and multiple processor modules (not shown) disposed below the liquid-cooled heat sinks 320 of the liquid-based cooling system 315.

In addition to liquid-cooled heat sinks 320, liquid-based cooling system 315 includes multiple coolant-carrying tubes, including coolant supply tubes 340 and coolant return tubes 342 in fluid communication with respective liquid-cooled heat sinks 320. The coolant-carrying tubes 340, 342 are also connected to a header (or manifold) subassembly 350 which facilitates distribution of liquid coolant to the coolant supply tubes and return of liquid coolant from the coolant return tubes 342. In this embodiment, the air-cooled heat sinks 334 coupled to memory support modules 332 closer to front 331 of electronic system 313 are shorter in height than the air-cooled heat sinks 334' coupled to memory support modules 332 near back 333 of electronic system 313. This size difference is to accommodate the coolant-carrying tubes 340, 342 since, in this embodiment, the header subassembly 350 is at the front 331 of the electronics drawer and the multiple liquid-cooled heat sinks 320 are in the middle of the drawer.

Liquid-based cooling system 315 comprises, in one embodiment, a pre-configured monolithic structure which includes multiple (pre-assembled) liquid-cooled heat sinks 320 configured and disposed in spaced relation to engage respective heat-generating electronic components. Each liquid-cooled heat sink 320 includes, in this embodiment, a liquid coolant inlet and a liquid coolant outlet, as well as an attachment subassembly (i.e., a cold plate/load arm assembly). Each attachment subassembly is employed to couple its respective liquid-cooled heat sink 320 to the associated electronic component to form the cold plate and electronic component (or device) assemblies. Alignment openings (i.e., thru-holes) are provided on the sides of the heat sink to receive alignment pins or positioning dowels during the assembly process. Additionally, connectors (or guide pins) are included within attachment subassembly, which facilitate use of the attachment assembly.

As shown in FIG. 3, header subassembly 350 includes two liquid manifolds, i.e., a coolant supply header 352 and a coolant return header 354, which in one embodiment, are coupled together via supporting brackets. In the monolithic cooling structure of FIG. 3, the coolant supply header 352 is metallurgically bonded in fluid communication to each coolant supply tube 340, while the coolant return header 354 is metallurgically bonded in fluid communication to each coolant return tube 352. A single coolant inlet 351 and a single coolant outlet 353 extend from the header subassembly for coupling to the electronics rack's coolant supply and return manifolds (not shown).

FIG. 3 also depicts one embodiment of the pre-configured, coolant-carrying tubes. In addition to coolant supply tubes 340 and coolant return tubes 342, bridge tubes or lines 341 are provided for coupling, for example, a liquid coolant outlet of one liquid-cooled heat sink to the liquid coolant inlet of another liquid-cooled heat sink to connect in series fluid flow the heat sinks, with the pair of heat sinks receiving and returning liquid coolant via a respective set of coolant supply and return tubes. In one embodiment, the coolant supply tubes 340, bridge tubes 341 and coolant return tubes 342 are each pre-configured, semi-rigid tubes formed of a thermally conductive material, such as copper or aluminum, and the tubes are respectively brazed, soldered or welded in a fluid-tight manner to the header subassembly and/or the liquid-cooled heat sinks The tubes are pre-configured for a particular electronics system to facilitate installation of the monolithic structure in engaging relation with the electronic system.

Figure 4A:
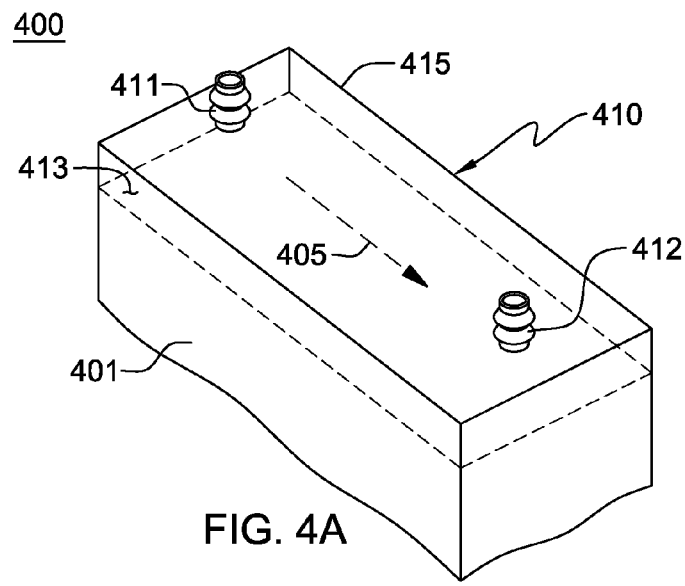
FIG. 4A depicts one embodiment of a cooled electronic module comprising at least one electronic component and a cooling apparatus comprising a liquid-cooled heat sink, in accordance with one or more aspects of the present invention.
Figure 4B:
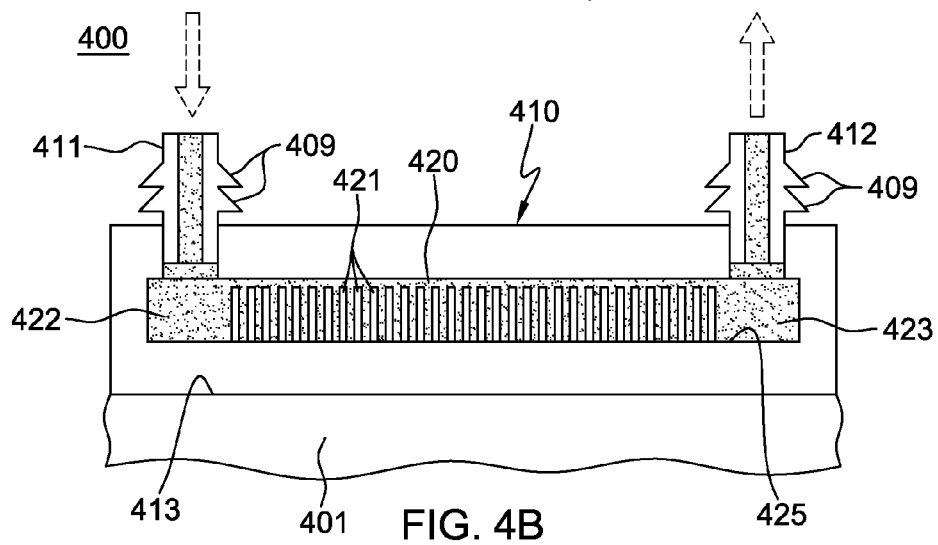
FIG. 4B depicts a cross-sectional elevational view of one embodiment of the liquid-cooled heat sink of FIG. 4A, taken through the coolant inlet and outlet tubes, in accordance with one or more aspects of the present invention.

FIGS. 4A-4B depict in greater detail one embodiment of a cooled electronic module, generally denoted 400, in accordance with one or more aspects of the present invention. Referring collectively to FIGS. 4A-4B, cooled electronic module 400 includes one or more electronic components 401 to be cooled and a cooling apparatus comprising a liquid-cooled heat sink 410 coupled to the electronic component(s) 401 to facilitate transfer of heat from the component to, for instance, the liquid coolant passing through liquid-cooled heat sink 410. In one example, the liquid coolant may comprises a system coolant distributed such as described above in connection with FIGS. 1-3.

Liquid-cooled heat sink 410 includes a thermally conductive structure 415, such as a thermally conductive casing or housing, fabricated (for instance) of a metal, and which includes a coolant-carrying compartment 420 (e.g., chamber, channel, tube, passageway, etc.) through which coolant flows in a direction 405 through the compartment from a coolant inlet tube 411 to a coolant outlet tube 412 of liquid-cooled heat sink 410. In this example, thermally conductive structure 415 includes a horizontal main heat transfer surface 413 coupled to and in thermal communication with the electronic component(s) 401 to facilitate heat transfer from the component(s) to the heat sink, and hence, to the liquid coolant flowing through the heat sink. As one example, main heat transfer surface 413 may comprise the base surface of a liquid-cooled heat sink or cold plate configured as disclosed herein.

By way of further detail, the coolant inlet tube 411, and coolant outlet tube 412 may comprise, in one example, separately manufactured tubes which are metallurgically bonded to the thermally conductive structure 415. These tubes may include circumferential barbs 409 (in one embodiment) for forming a fluid-tight connection with a coolant hose to facilitate the flow of liquid coolant through the liquid-cooled heat sink 410. In the embodiment of FIG. 4B, a plurality of thermally conductive fins 421 are disposed within coolant-carrying compartment 420 to extend, for instance, upwards from a base surface 425 thereof. The thermally conductive fins are provided to facilitate heat transfer from the heat sink to the liquid coolant flowing through the coolant-carrying compartment, and the plurality of thermally conductive fins 421 may comprise various configurations, including pin fins or plate fins, and, if desired, coolant flow channels of varying cross-section to further enhance heat transfer. The coolant inlet tube provides liquid coolant to a coolant inlet manifold region 422 of coolant-carrying compartment 420, and the coolant outlet tube exhausts liquid coolant from a coolant outlet manifold region 423 of coolant-carrying compartment 420.

As noted briefly above, in one embodiment, the cooling apparatus of FIGS. 1-4B may have an operational mode, during which liquid coolant flows through the cooling apparatus to facilitate dissipating heat from one or more electronic components or electronic systems of, for instance, an electronics rack, and a transport mode, for which a significant portion of the liquid coolant within the cooling apparatus is removed to reduce or eliminate any damage to the cooling apparatus resulting from freezing during transport. In the embodiment of FIGS. 3-4B, the liquid-cooled heat sinks are configured to mount horizontally to one or more electronic component surfaces to be cooled. Additionally, as illustrated in FIG. 3, the supply and return headers for the liquid coolant flow may be above the liquid-cooled heat sink(s). Thus, transitioning of the cooling apparatus from an operational mode to a transport mode where it is desired that most of the liquid coolant be removed from the cooling apparatus, may prove problematic.

Figure 4C:
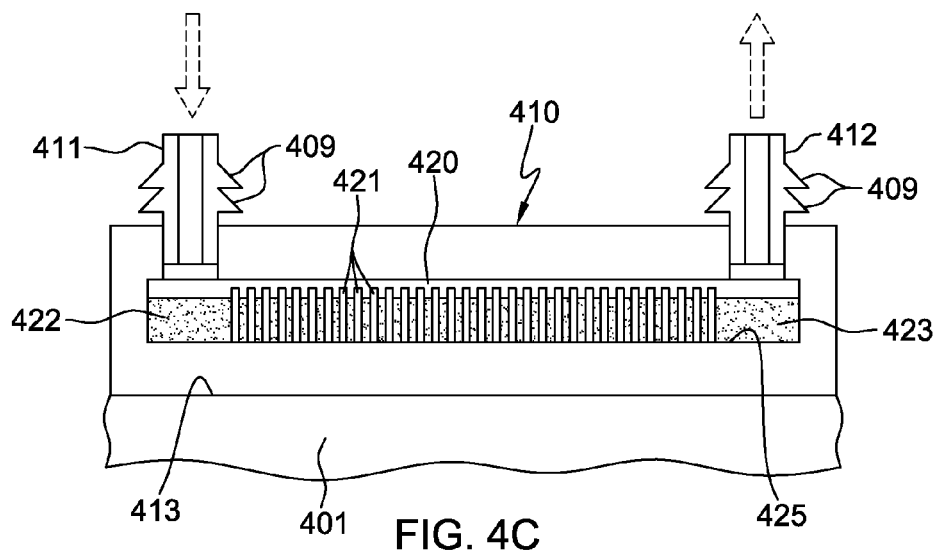
FIG. 4C depicts the liquid-cooled heat sink of FIG. 4B, with the cooling apparatus in a transport mode, and showing liquid coolant partially drained from the coolant-carrying compartment of the heat sink, in accordance with one or more aspects of the present invention.

As shown in FIG. 4C, in attempting to drain or pump liquid coolant from the cooling apparatus, it is possible that a certain volume of coolant will remain within the coolant-carrying compartment of the heat sink, as illustrated in FIG. 4C. This is particularly likely in the case where the liquid-cooled heat sink couples along a horizontal main heat transfer surface to the one or more electronic components to be cooled, with the coolant inlet and outlet tubes being mounted to the heat sink through an upper portion (or surface) of the heat sink, such as illustrated in FIGS. 3-4C. Even in the case where compressed air is employed to remove liquid coolant from the cooling apparatus, it is possible that an undesirable amount of liquid coolant may remain within the coolant-carrying compartment of a liquid-cooled heat sink positioned and configured as described herein.

Figure 5:
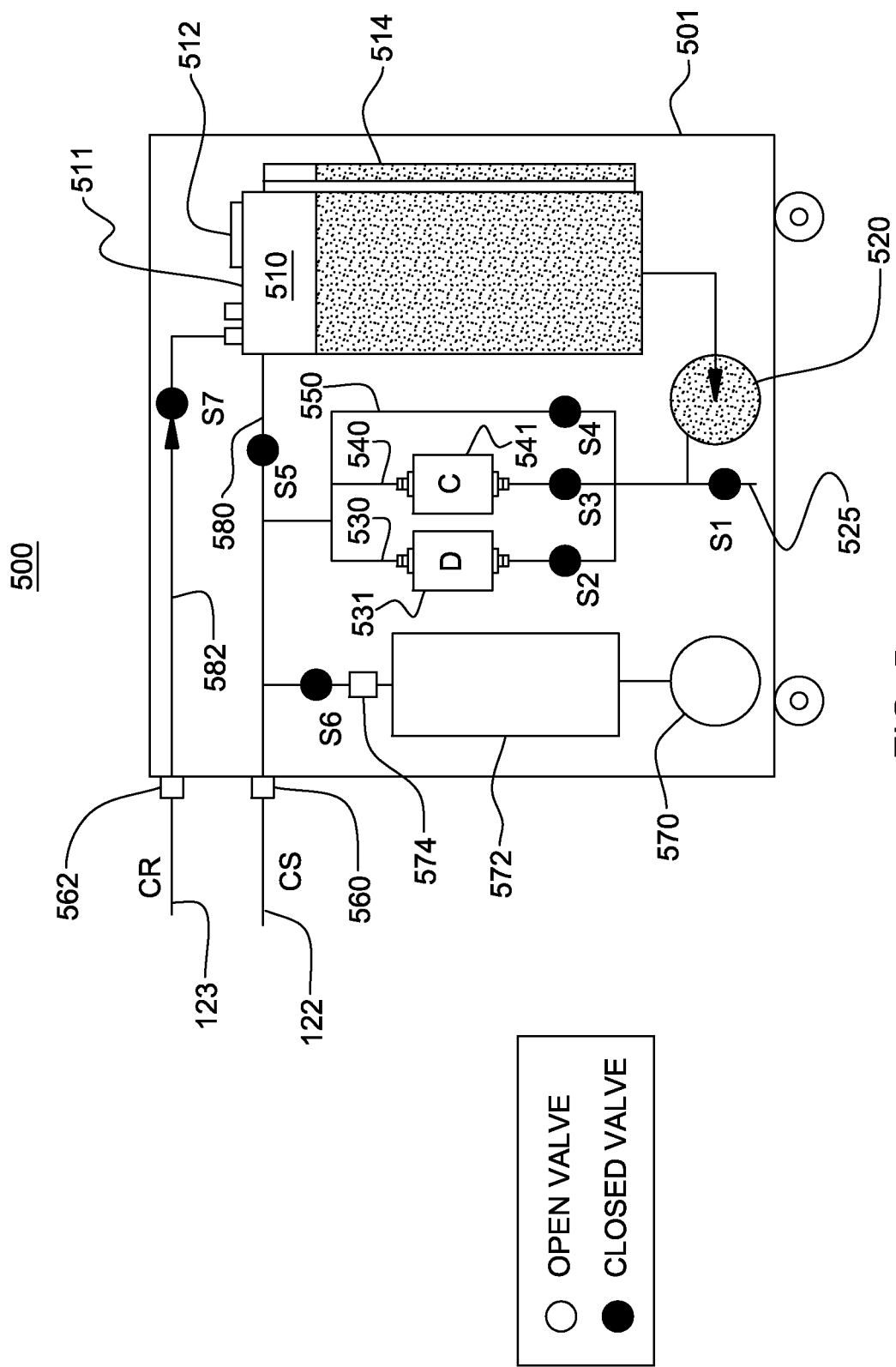
FIG. 5 is a schematic of one embodiment of a coolant-servicing apparatus, which may be employed in transitioning the cooling apparatus disclosed herein between operational and transport modes, in accordance with one or more aspects of the present invention.

FIG. 5 depicts one embodiment of a coolant-servicing apparatus, generally denoted 500, which may be employed in transitioning a cooling apparatus to a transport mode. Coolant servicing apparatus 500 includes a coolant tank 510 and a coolant pump 520 in fluid communication with the coolant tank for pumping coolant therefrom. Coupled to an output of coolant pump 520 are a drain line 525 and multiple parallel-connected coolant supply lines 530, 540 & 550 for coupling the coolant pump to a coolant supply port 560 of coolant servicing apparatus 500. Drain line 525 includes a coolant control valve S1, which in one embodiment, is a solenoid-operated flow control valve.

Each coolant supply line 530, 540 & 550 of the multiple parallel-connected coolant supply lines also includes a solenoid-operated coolant control valve S2, S3 & S4, respectively, for selectively controlling flow of coolant therethrough pumped by coolant pump 520 from coolant tank 510 to coolant supply port 560. In the embodiment illustrated, coolant supply line 530 further includes a deionization filter 531, and coolant supply line 540 includes a particulate filter 541, such as a charcoal filter. Coolant supply line 550 is a bypass coolant supply line with no filter.

The coolant servicing apparatus 500 further includes a coolant return port 562. In one embodiment, coolant supply port 560 and coolant return port 562 are quick connect couplings, which respectively receive a supply line 122 (see FIG. 1) and a return line 123 (FIG. 1) for coupling the apparatus to the liquid-cooled electronics rack (see FIG. 1). The quick connect couplings may be any one of various types of commercially available couplings, such as those available from Colder Products Company, of St. Paul, Minn., USA, or Parker Hannifin, of Cleveland, Ohio, USA.

As illustrated, a first port line 580 couples coolant supply port 560 and one end of the multiple parallel-connected coolant supply lines to an upper portion of coolant tank 510 above a coolant full level. Similarly, a second port line 582 couples coolant return port 562 in fluid communication with an upper portion of coolant tank 510 above a coolant full level thereof. The first port line 580 includes a solenoid-operated coolant control valve S5, while the second port line 582 includes a solenoid-operated coolant control valve S7 for controlling flow of coolant or air therethrough.

The coolant servicing apparatus further includes a pressurized air source, which in the embodiment illustrated, comprise an air-compressor 570, an air-holding tank 572, an air-regulator 574 and an airflow control valve S6 coupled in-series for provision of pressurized air flow to the coolant supply port 560 of the apparatus for facilitating draining of coolant from the cooling system of the liquid-cooled electronics rack, and for facilitating draining of the coolant servicing apparatus 500 itself. In an alternate embodiment, other pressurized air sources may be employed. For example, the pressurized air source may be facility compressed air, or alternatively, a bottle of compressed gas, such as nitrogen.

If desired, a controller (not shown) can be provided for automated control of the solenoid-operated control valves to implement the protocols for filling or draining the cooling apparatuses disclosed herein. Prior to automated operation, a service technician manually makes supply line and return line connections to the cooling apparatus or system of the liquid-cooled electronics rack and then, for example, pushes a button or otherwise initiates operation of the coolant servicing apparatus employing a controller programmed with the desired logic flows, such as the draining operation described hereinbelow. Alternatively, it is possible to have a fully manual implementation of the coolant servicing protocols.

As noted, in one embodiment, liquid coolant may be drained from the apparatus of FIGS. 1-4B employing the coolant-servicing apparatus of FIG. 5. Liquid-coolant drainage begins by disconnecting system coolant supply and return lines coupling (for instance) a liquid-cooled electronics rack to a coolant distribution unit, such as depicted in FIG. 1, and connecting the coolant supply line (e.g., line 122 of FIG. 1) to the coolant supply port 560 and the coolant return line 123 to the coolant return port 562. The coolant tank access cover 512 may be opened, main power is turned ON to the coolant-servicing apparatus, and the air-compressor 570 is turned ON. Control valve S6 & S7 are opened, allowing air to push through the cooling system and back to the coolant tank. This operation continues for a period time, after which the air-compressor is turned OFF, and control valves S6 & S7 are closed. The main power to the coolant-servicing apparatus is then turned OFF, and the coolant tank access cover is closed.

The defined time interval for drainage is selected so most of the coolant is drained from the cooling system upon expiration of that time interval. The amount of time required to drain a particular cooling system can be readily determined by experimentation. Draining the cooling system is intended to prepare the liquid-cooled electronics rack for shipment under conditions which freezing of coolant could occur. This is referred to as the transport mode of the cooling apparatus or electronics rack. Thus, a sufficient amount of coolant needs to be removed from each component of the cooling apparatus in critical areas of the system, to preclude the possibility of damage during freezing. The specific time required to achieve this goal depends upon the volume of the cooling system, the volume of the air-holding tank in the apparatus, and the air regulator discharge pressure. Note that although not relevant to the concepts disclosed herein, the coolant-servicing apparatus 500 of FIG. 5 is also employed in filling the cooling apparatus (or system) during switching from transport mode back to an operational mode at, for instance, a customer site.

Figure 6A:
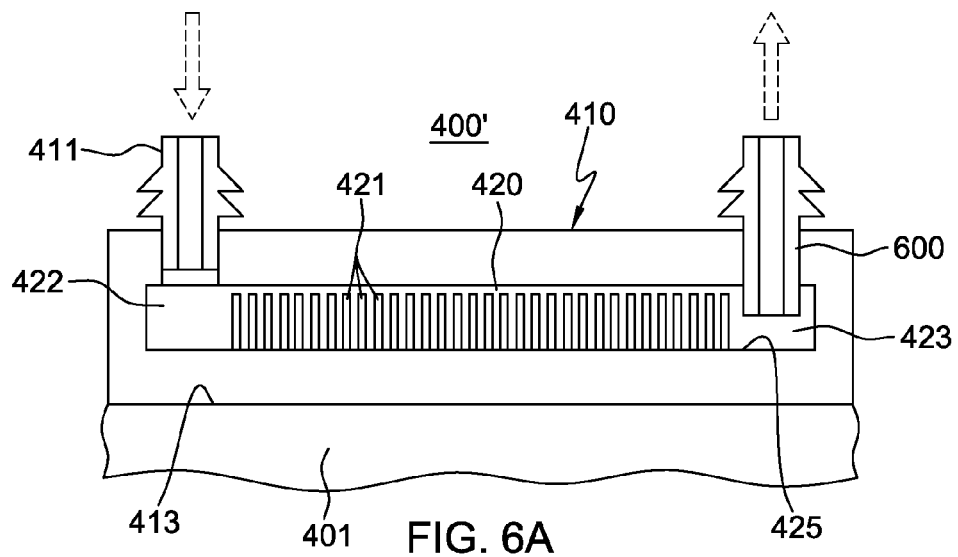
FIG. 6A is a cross-sectional elevational view of an alternate embodiment of a liquid-cooled heat sink such as depicted in FIG. 4A, taken through the coolant inlet and outlet tubes thereof, and illustrating an extended coolant outlet tube reaching further into the coolant-carrying compartment of the heat sink, in accordance with one or more aspects of the present invention.
Figure 6B:
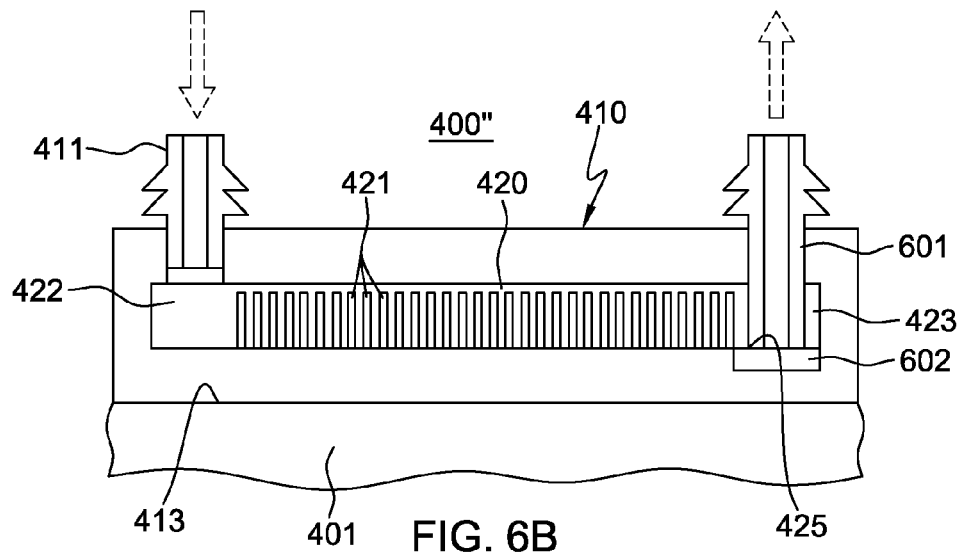
FIG. 6B depicts an alternate embodiment of the liquid-cooled heat sink of FIG. 6A, in accordance with one or more aspects of the present invention.
Figure 6C:
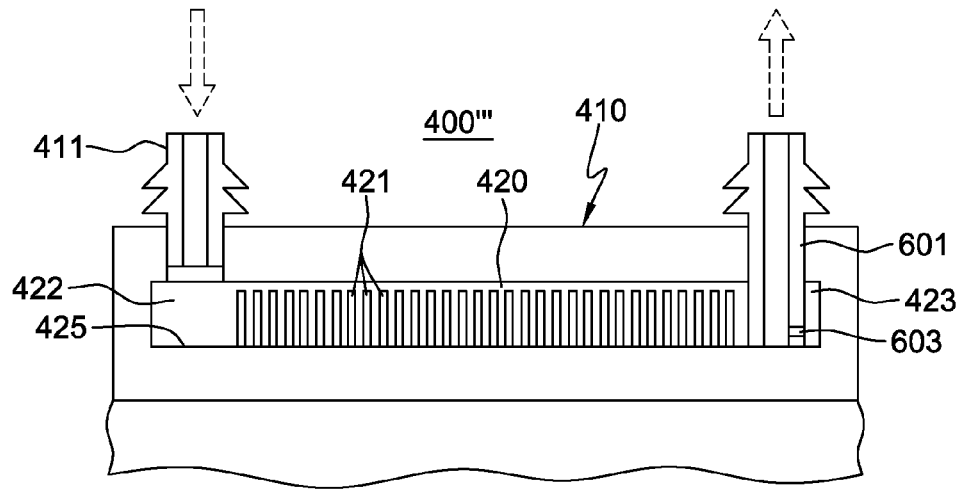
FIG. 6C depicts another embodiment of the liquid-cooled heat sink of FIGS. 6A & 6B, in accordance with one or more aspects of the present invention.

To further assist in drainage of the system coolant from a horizontally-oriented, liquid-cooled heat sink, such as illustrated above in connection with FIGS. 4A-4C, variations on the heat sink structure are disclosed in FIGS. 6A-6C, and described below. Note that the liquid-cooled heat sinks of FIGS. 6A-6C are provided by way of example only. Also, unless indicated otherwise, the structures of FIGS. 6A-6C are analogous to those described above in connection with FIGS. 4A & 4B.

Referring first to the embodiment of FIG. 6A, the liquid-cooled heat sink 400' disclosed herein includes a thermally conductive structure 415 configured or designed to couple along a horizontal main heat transfer surface 413 thereof to at least one electronic component 401 to be cooled. The thermally conductive structure 415 includes a coolant-carrying compartment 420 through which liquid coolant flows, at least in part, in a direction substantially parallel to the horizontal main heat transfer surface 413 of thermally conductive structure 415. A coolant inlet tube 411 and a coolant outlet tube 600 are provided in association with the thermally conductive structure 415. For instance, the coolant inlet and outlet tubes could be separately fabricated and metallurgically bonded (e.g., brazed or welded) to the thermally conductive structure 415 in a fluid-tight manner, and so as to be in fluid communication with the coolant-carrying compartment 420 of the thermally conductive structure 415 to facilitate liquid coolant flow therethrough. In an alternate implementation, the thermally conductive structure could be fabricated such that the coolant inlet tubes and coolant outlet tubes are a part of the thermally conductive structure, rather than coupled or affixed to the thermally conductive structure. In either case, the inlet and outlet tubes include respective coolant-carrying channels or openings through which the liquid coolant flows. The coolant-carrying compartment 420 of the thermally conductive structure 415 has a base surface 425, and in the embodiment of FIG. 6A, the coolant outlet tube 600 extends into the coolant-carrying compartment 420 towards base surface 425 thereof to facilitate withdrawal of any liquid coolant therefrom during a drain operation using, for instance, a coolant-servicing apparatus such as depicted in FIG. 5. Depending upon the implementation, it may be desired that substantially all of the liquid coolant be withdrawn from the cooling apparatus, for instance, when transitioning to a transport mode of the cooling apparatus or electronic system.

Note that in the embodiment of FIG. 6A, the coolant-carrying compartment 420 includes multiple thermally conductive fins 421 extending upwards from base surface 425, and disposed between coolant inlet manifold region 422 and coolant outlet manifold region 423. As noted above, the thermally conductive fins 421 are disposed within coolant-carrying compartment 420 to facilitate heat transfer from the heat sink to the liquid coolant flowing through the coolant-carrying compartment, and may comprise various configurations, including pin fins or plate fins, and if desired, coolant flow channels of varying cross-section, to further enhance heat transfer. In the illustrated embodiment, coolant outlet tube 600 extends into the coolant outlet manifold region 423, close to base surface 425 of coolant-carrying compartment 420. For instance, the coolant outlet tube 600 may extend into the coolant-carrying compartment 420 to a lower portion or lower half of the multiple thermally conductive fins 421, as illustrated. Thus, coolant outlet tube 600 extends into coolant-carrying compartment 420 to a lower region of the coolant-carrying compartment itself. Therefore, upon draining the cooling apparatus using, for instance, a coolant-serving apparatus such as described above in connection with FIG. 5, more liquid coolant will advantageously be removed from coolant-carrying compartment 420 of liquid-cooled heat sink 400' since the outlet tube is lower within the coolant-carrying compartment.

FIG. 6B depicts an alternate embodiment of a liquid-cooled heat sink 400" analogous to liquid-cooled heat sink 400' described above in connection with FIG. 6A, except that in this embodiment, the coolant outlet tube 601 extends down to meet (or approximately meet) base surface 425 of coolant-carrying compartment 420. Further, the heat sink includes a recess 602 aligned below coolant outlet tube 601 and sized and configured to facilitate liquid coolant flow into the opening or channel of coolant outlet tube 601 from coolant-carrying compartment 420. Note in this embodiment, coolant outlet tube 601 could extend to just short of base surface 425 of coolant-carrying compartment 420, or even extend slightly into recess 602, depending on the size of the recess and size of the coolant outlet tube 601. The balance being disclosed herein is between ensuring better removal of coolant from a horizontally-disposed, liquid-cooled heat sink, while not significantly affecting pressure drop of coolant flow through the heat sink in normal operation.

FIG. 6C depicts a further variation, wherein a liquid-cooled heat sink 400''' is provided which includes a coolant outlet tube 601 that again extends into the coolant-carrying compartment 420, and in this case, through the coolant outlet manifold region 423 to contact (or almost contact) base surface 425 of coolant-carrying compartment 420. One or more openings 603 are provided in a sidewall of the coolant outlet tube 601 to facilitate coolant drainage from the coolant-carrying compartment through the coolant outlet tube 601. Note that the one or more openings 603 in the sidewall of the coolant outlet tube 601 are located in a lower region of the coolant-carrying compartment 420 of the thermally conductive structure 415 to facilitate enhanced drainage of liquid coolant from the coolant-carrying compartment when transitioning the cooling apparatus from, for instance, an operational mode to a transport mode, where most, if not all, of the liquid coolant is to be removed from the cooling apparatus.

Note that if desired, the embodiments of FIGS. 6B & 6C could be combined, with a recess being provided in the thermally conductive structure aligned below the coolant outlet tube 601 illustrated in FIG. 6C to, for instance, provide further coolant flow through the heat sink via the coolant outlet tube.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus comprising:
   a liquid-cooled heat sink, the liquid-cooled heat sink comprising:
      a thermally conductive structure configured to couple along a horizontal main heat transfer surface thereof to at least one electronic component to be cooled, the thermally conductive structure comprising a coolant-carrying compartment through which liquid coolant flows, at least in part, in a direction substantially parallel to the horizontal main heat transfer surface of the thermally conductive structure;
      a coolant inlet tube and a coolant outlet tube associated with the thermally conductive structure and in fluid communication with the coolant-carrying compartment of the thermally conductive structure to facilitate the liquid coolant flow therethrough; and
      wherein the coolant-carrying compartment of the thermally conductive structure comprises a base surface, and the coolant outlet tube extends into the coolant-carrying compartment to the base surface of the coolant-carrying compartment and the base surface of the coolant-carrying compartment includes a recess aligned below the coolant outlet tube to facilitate liquid coolant flow into the coolant outlet tube from the coolant-carrying compartment and thereby facilitate withdrawal of the liquid coolant therefrom for a transport mode of the cooling apparatus.

2. The cooling apparatus of claim 1, wherein the thermally conductive structure includes multiple thermally conductive fins within the coolant-carrying compartment, and the coolant outlet tube extends into the coolant-carrying compartment to a lower portion of the multiple thermally conductive fins.

3. The cooling apparatus of claim 1, wherein the thermally conductive structure further includes:
   multiple thermally conductive fins within the coolant-carrying compartment; and
   a coolant inlet manifold region and a coolant outlet manifold region within the coolant-carrying compartment, the coolant inlet manifold region receiving coolant from the coolant inlet tube, and the coolant outlet manifold region exhausting coolant through the coolant outlet tube, the multiple thermally conductive fins within the coolant-carrying compartment being disposed, at least in part, between the coolant inlet manifold region and the coolant outlet manifold region thereof, and the coolant outlet tube extending into the coolant outlet manifold region of the coolant-carrying compartment.

4. The cooling apparatus of claim 1, wherein the thermally conductive structure further comprises a coolant inlet manifold region and a coolant outlet manifold region within the coolant-carrying compartment, the coolant inlet manifold region receiving coolant from the coolant inlet tube, and the coolant outlet manifold region exhausting coolant through the coolant outlet tube, wherein the coolant outlet tube extends into the coolant outlet manifold region of the coolant-carrying compartment to a lower region of the coolant-carrying compartment.

5. A cooled electronic module comprising:
at least one electronic component to be cooled; and
a cooling apparatus to facilitate cooling the at least one electronic component, the cooling apparatus comprising:
 a liquid-cooled heat sink coupled to the at least one electronic component to be cooled along a horizontal main heat transfer surface thereof, the liquid-cooled heat sink comprising:
  a thermally conductive structure comprising the horizontal main heat transfer surface of the liquid-cooled heat sink, and a coolant-carrying compartment through which coolant flows, at least in part, in a direction substantially parallel to the main heat transfer surface of the liquid-cooled heat sink;
  a coolant inlet tube and a coolant outlet tube associated with the thermally conductive structure and in fluid communication with the coolant-carrying compartment of the thermally conductive structure to facilitate the liquid coolant flow therethrough; and
  wherein the coolant-carrying compartment of the thermally conductive structure comprises a base surface, and the coolant outlet tube extends into the coolant-carrying compartment to the base surface of the coolant-carrying compartment and the base surface of the coolant-carrying compartment includes a recess aligned below the coolant outlet tube to facilitate liquid coolant flow into the coolant outlet tube from the coolant-carrying compartment and thereby withdrawal of the liquid coolant therefrom for a transport mode of the cooled electronic module.

6. The cooled electronic module of claim 5, wherein the thermally conductive structure includes multiple thermally conductive fins within the coolant-carrying compartment, and the coolant outlet tube extends into the coolant-carrying compartment to a lower portion of the multiple thermally conductive fins.

7. The cooled electronic module of claim 5, wherein the thermally conductive structure further includes:
multiple thermally conductive fins within the coolant-carrying compartment; and
a coolant inlet manifold region and a coolant outlet manifold region within the coolant-carrying compartment, the coolant inlet manifold region receiving coolant from the coolant inlet tube, and the coolant outlet manifold region exhausting coolant through the coolant outlet tube, the multiple thermally conductive fins within the coolant-carrying compartment being disposed, at least in part, between the coolant inlet manifold region and the coolant outlet manifold region thereof, and the coolant outlet tube extending into the coolant outlet manifold region of the coolant-carrying compartment.

8. The cooled electronic module of claim 5, wherein the thermally conductive structure further comprises a coolant inlet manifold region and a coolant outlet manifold region within the coolant-carrying compartment, the coolant inlet manifold region receiving coolant from the coolant inlet tube, and the coolant outlet manifold region exhausting coolant through the coolant outlet tube, wherein the coolant outlet tube extends into the coolant outlet manifold region of the coolant-carrying compartment to a lower region of the coolant-carrying compartment.

9. A method comprising:
providing a cooling apparatus comprising a liquid-cooled heat sink configured to facilitate cooling at least one electronic component, the cooling apparatus comprising an operational mode and a transport mode, the liquid-cooled heat sink comprising:
 a thermally conductive structure configured to couple along a horizontal main heat transfer surface thereof to the at least one electronic component to be cooled, the thermally conductive structure comprising a coolant-carrying compartment through which liquid coolant flows, at least in part, in a direction substantially parallel to the horizontal main heat transfer surface of the thermally conductive structure;
 a coolant inlet tube and a coolant outlet tube associated with the thermally conductive structure and in fluid communication with the coolant-carrying compartment of the thermally conductive structure to facilitate the liquid coolant flow therethrough; and
 wherein the coolant-carrying compartment of the thermally conductive structure comprises a base surface, and the coolant outlet tube extends into the coolant-carrying compartment to the base surface of the coolant-carrying compartment and the base surface of the coolant-carrying compartment includes a recess aligned below the coolant outlet tube to facilitate liquid coolant flow into the coolant outlet tube from the coolant-carrying compartment and thereby withdrawal of the liquid coolant therefrom in the transport mode of the cooling apparatus.

\* \* \* \* \*